(12) United States Patent
Wilson et al.

(10) Patent No.: US 6,690,239 B2
(45) Date of Patent: Feb. 10, 2004

(54) HIGH BANDWIDTH, LOW POWER, SINGLE STAGE CASCODE TRANSIMPEDANCE AMPLIFIER FOR SHORT HAUL OPTICAL LINKS

(75) Inventors: Timothy M. Wilson, Champaign, IL (US); Tanay Karnik, Portland, OR (US); Luiz M. Franca-Neto, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/342,689

(22) Filed: Jan. 14, 2003

(65) Prior Publication Data

US 2003/0184388 A1 Oct. 2, 2003

Related U.S. Application Data

(62) Division of application No. 10/107,679, filed on Mar. 26, 2002.

(51) Int. Cl.$^7$ .............................. H03F 3/08; H03F 1/22
(52) U.S. Cl. ..................................... 330/308; 330/311
(58) Field of Search ................................. 330/308, 311; 250/214 A (56) References Cited

U.S. PATENT DOCUMENTS

| | | | |
|---|---|---|---|
| 6,037,841 A | * | 3/2000 | Tanji et al. .................. 330/308 |
| 6,509,799 B1 | * | 1/2003 | Franca-Neto ................ 330/311 |
| 6,556,085 B2 | * | 4/2003 | Kwon et al. ................. 330/311 |

* cited by examiner

*Primary Examiner*—Khanh Van Nguyen
(74) *Attorney, Agent, or Firm*—Seth Z. Kalson (57) ABSTRACT

A high bandwidth, single stage, low power cascode transimpedance amplifier for short haul optical links. In one embodiment, an input signal is fed into the source of a common-gate pMOSFET, the output signal is taken at the drain of the common-gate pMOSFET, and bias current is supplied by a pMOSFET and a nMOSFET biased in their triode regions.

3 Claims, 7 Drawing Sheets

HIGH BANDWIDTH, LOW POWER, SINGLE STAGE CASCODE TRANSIMPEDANCE AMPLIFIER FOR SHORT HAUL OPTICAL LINKS

FIELD

The present invention relates to electronic analog circuits, and more particularly, to transimpedance amplifiers.

BACKGROUND

With increasing data rates in electronic systems, it is expected that optical interconnects (optical fibers) may in the near future replace wire interconnects at the board-to-board and chip-to-chip level. For example, a computer system such as that illustrated in FIG. 1 may comprise one or more boards 102 and memory hierarchy 104 that exchange data packets over optical interconnects 106. These packets may be routed via switch 108, or perhaps the various integrated circuits may be directly connected to one another. Each board 102 may comprise one or more microprocessors.

In many applications, a photo-detector provides an electrical signal indicative of a received optical signal. A simplified small-signal model for a photo-detector is a small-signal current source, where the small-signal current is representative of the received optical signal. Transimpedance amplifiers provide a small-signal output voltage signal in response to a small-signal input current signal. Many transimpedance amplifiers used in optoelectronic telecommunication applications employ the two popular designs shown in FIGS. 2a and 2b.

Figure 2A:
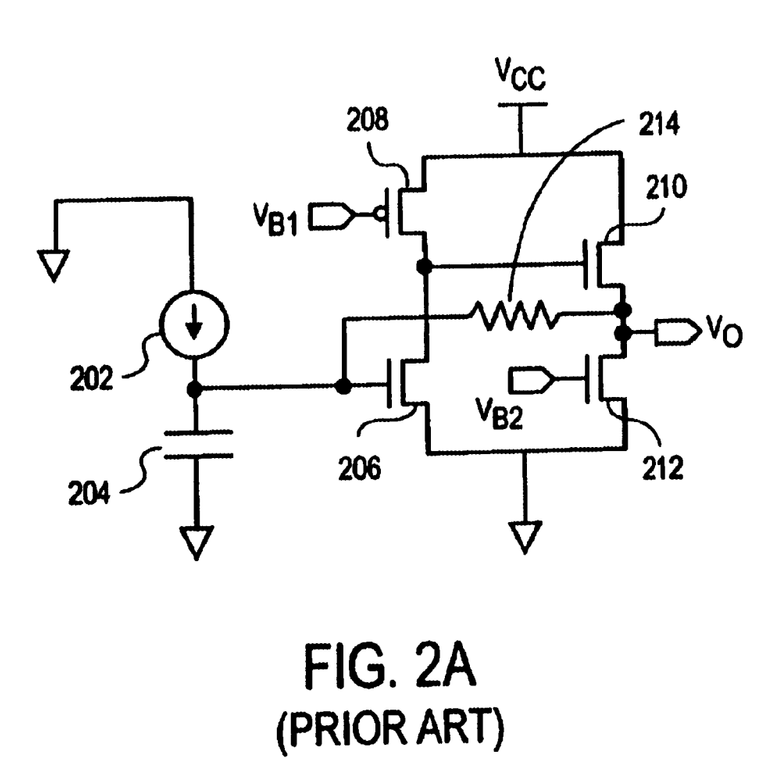
FIGS. 2a and 2b are prior art transimpedance amplifiers for optoelectronic applications.
Figure 2B:
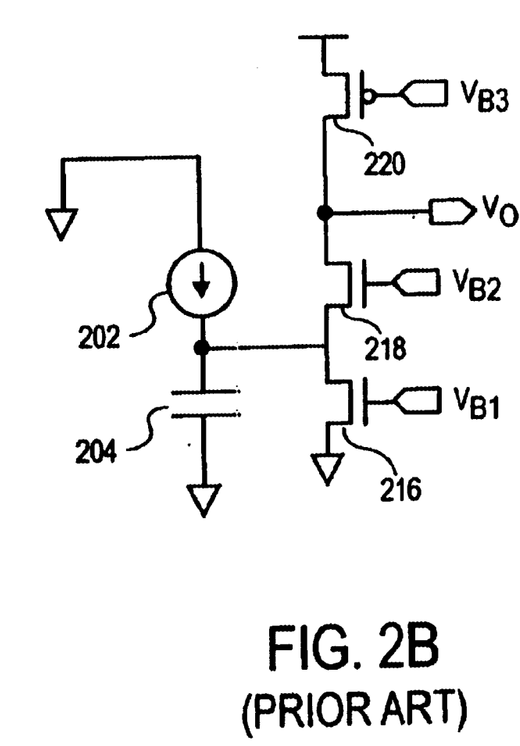

The photo-detector in FIGS. 2a and 2b is modeled as small-signal current source 202 and small-signal parasitic capacitor 204. The transimpedance amplifier of FIG. 2a is a two stage, common-source, common-drain amplifier. The first stage comprises common-source nMOSFET (n-Metal-Oxide-Semiconductor-Field-Effect-Transistor) 206 and load pMOSFET 208. The second stage comprises common-drain nMOSFET 210 and load pMOSFET 212. Resistor 214 provides negative feedback. The transimpedance amplifier of FIG. 2b is a single stage, common-gate amplifier, where the single stage comprises common-gate nMOSFET 218, with nMOSFET 216 and pMOSFET 220 providing bias current and active loads to common-gate nMOSFET 218.

In telecommunication applications, the received optical signals are typically very small due to attenuation in optical fibers, which may be hundreds of kilometers long. Consequently, a primary goal for transimpedance amplifiers for long haul communications is to provide high transimpedance with low noise amplification, while attaining as large a bandwidth as practical.

Figure 1:
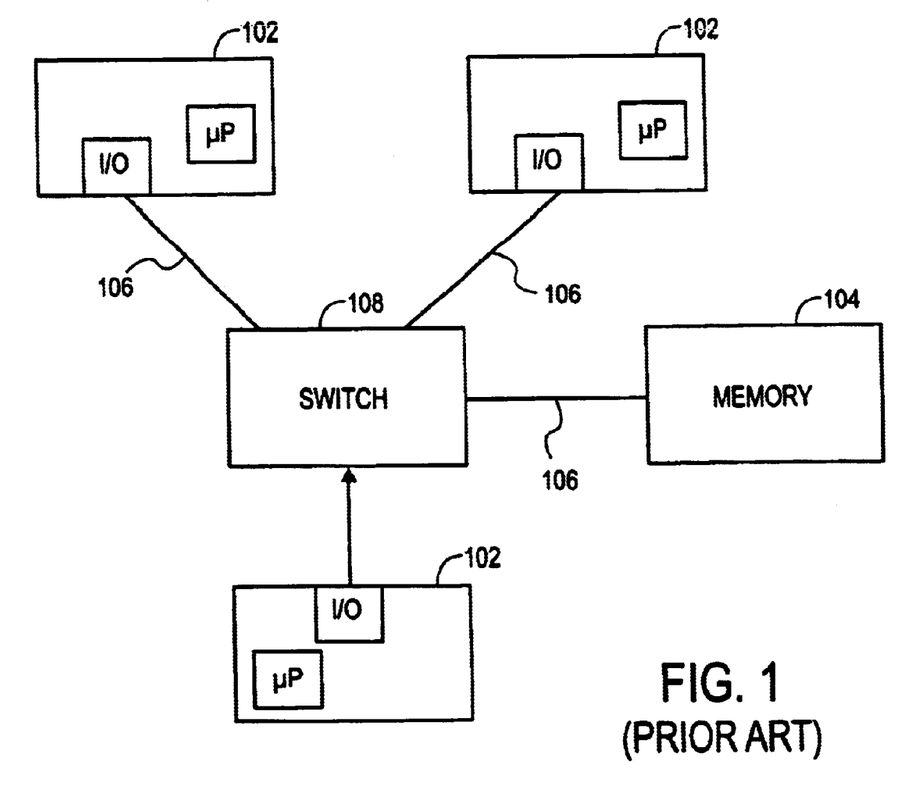
FIG. 1 is a prior art computer system using optical signals for board-to-board communication.

However, at the board-to-board and chip-to-chip level, such as the computer system of FIG. 1, attenuation is relatively negligible, and the received signals are typically orders of magnitude larger than for the case of long haul optical communication systems. In such short haul optical applications, transimpedance amplifiers may be integrated with other circuits on an integrated circuit die, such as input-output chips on boards 102 or switch 108, and perhaps on a microprocessor itself. Accordingly, for such applications, designing for large bandwidth while minimizing power plays a critical role in the design of transimpedance amplifiers. Under these criteria, the amplifiers in FIGS. 2a and 2b may contain several drawbacks.

One drawback is that each stage in the amplifier of FIG. 2a requires a relatively large DC bias current. Furthermore, the two load transistors 208 and 212 are each biased at bias voltages $V_{B1}$ and $V_{B2}$, respectively. To avoid bias voltage coupling, two bias circuits may be needed to bias the load transistors. Consequently, power consumption for the circuit of FIG. 2a may be too high. Another drawback is that common-drain nMOSFET 210 may cause a 30% to 50% drop in transimpedance from the first stage output to the second stage output.

The amplifier of FIG. 2b contains only one stage, but transistors 216, 218, and 220 require three bias voltages $V_{B1}$, $V_{B2}$, and $V_{B3}$, respectively. Again, to avoid bias voltage coupling, three separate bias circuits may be needed for the amplifier of FIG. 2b, thus contributing to power consumption. Furthermore, a problem shared by amplifiers requiring one or more constant bias voltages is that generating a constant bias voltage with good power supply noise rejection is considered a difficult problem.

Consequently, transimpedance amplifiers that are commonly used for long haul communications may not be suitable for short haul optical communications, such as computer systems, where power consumption may be an issue.

BRIEF DESCRIPTION OF THE DRAWINGS

FIG. 4 is a low frequency small-signal model for the embodiment of FIG. 3a.

DESCRIPTION OF EMBODIMENTS

Figure 3A:
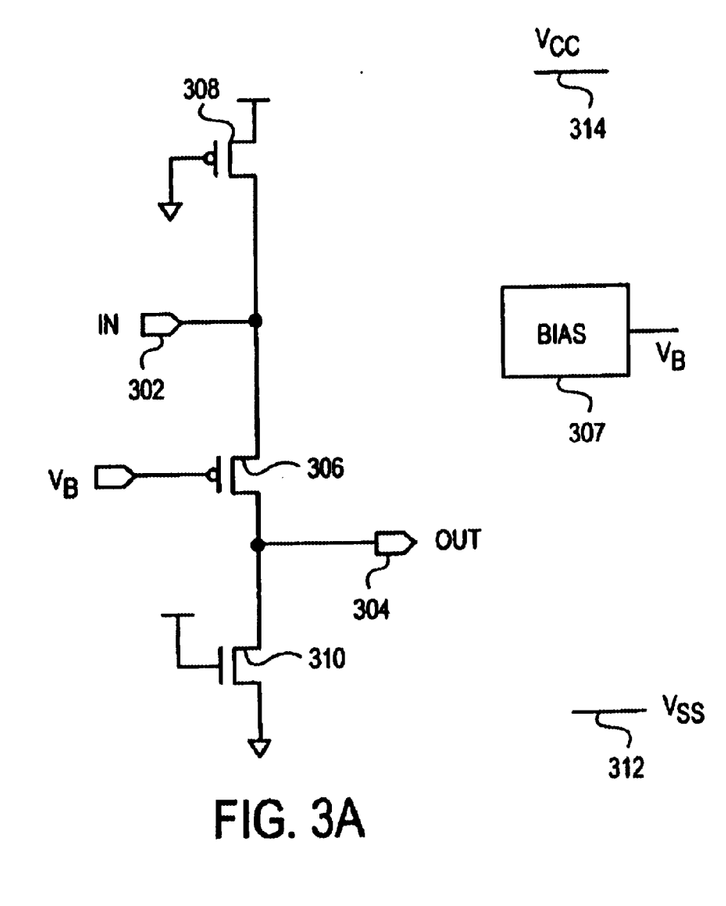
FIGS. 3a and 3b are transimpedance amplifiers according to embodiments of the present invention, each with a pMOSFET common-gate transistor.

A single stage, common-gate transimpedance amplifier according to an embodiment of the present invention is shown at the circuit level in FIG. 3a. Input port 302 receives a signal from a current source, such as a photo-detector (not shown), and the output voltage is provided at output port 304. Input port 302 is connected to the source of common-gate pMOSFET 306, with gate biased to bias voltage $V_B$ by bias circuit 307. (Standard nomenclature is employed in referring to pMOSFET 306 as a common-gate transistor because its small-signal gate voltage is at small-signal ground.) The output port is taken at the drain of pMOSFET 306. Biasing current and active loads are provided by pMOSFET 308 and nMOSFET 310, with their gates connected to ground rail (substrate) 312 and power rail 314, respectively.

We follow the usual convention in which the voltages of ground rail 312 and power rail 314 are denoted, respectively, as $V_{SS}$ and $V_{CC}$. The bias voltage $V_B$ is some voltage chosen between $V_{SS}$ and $V_{CC}$ so that pMOSFET 306 is biased in its active region. Only one biasing circuit is required for the amplifier of FIG. 3a. With only one stage and one biasing circuit needed, power consumption may be kept relatively low compared to the amplifiers of FIGS. 2a and 2b.

Figure 4:
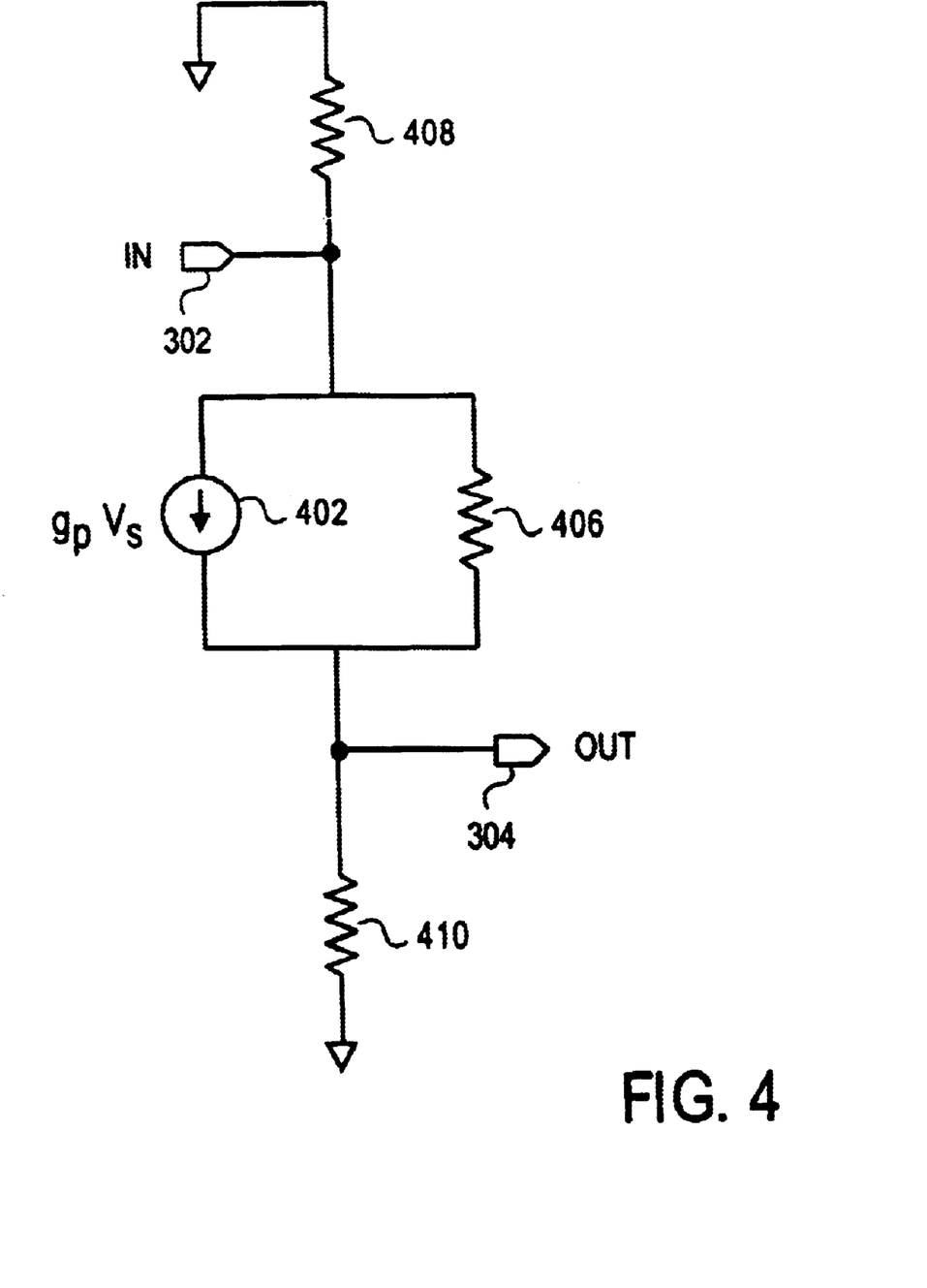

It is instructive to consider a small-signal low frequency model for the circuit of FIG. 3a, shown in FIG. 4. Small-signal voltage-controlled current source 402 and small-signal drain-source resistor 406 model pMOSFET 306 in its active region, where $g_m$ is the transconductance and $v_s$ is the small-signal source voltage for pMOSFET 306. Because the source and gate voltages of pMOSFET 308 and nMOSFET 310 are ideally constant, pMOSFET 308 may be represented by small-signal drain-source resistor 408 and nMOSFET 310 may be represented by small-signal drain-source resistor 410, where both low frequency models apply for either their triode regions or active regions, although the numerical values for the small-signal drain-source resistances depend upon which region is applicable. It is expected that both pMOSFET 308 and nMOSFET 310 will operate in their triode regions.

Let $Z_{IN}$ and $Z_T$ denote, respectively, the small-signal, low frequency input impedance and transimpedance for the amplifier of FIG. 3a, assuming that any external small-signal load connected to output port 304 is very high and may be neglected. For pMOSFET 308 and nMOSFET 310 operating in their triode regions, and with pMOSFET 306 operating in its active region, the resistances of resistors 408 and 410 may be taken to be substantially less than the resistance of resistor 406. That is, the small-signal drain-source resistances of pMOSFET 308 and nMOSFET 310 are each substantially less than the small-signal drain-source resistance of common-gate pMOSFET 306. With this simplifying assumption, it can be shown from the small-signal model of FIG. 4 that the small-signal input impedance and transimpedance are approximately $Z_{IN} \approx \alpha 1/g_m$ and $Z_T \approx \alpha r_n$, where $r_n$ is the resistance of resistor 410 and $\alpha$ is a positive number less than 1, $0 < \alpha < 1$, given by $\alpha = r_p g_m/(1+r_p g_m)$ where $r_p$ is the resistance of resistor 408.

For comparison, consider the case in which the resistances of resistors 408 and 410 are now substantially larger than the resistance of resistor 406. For example, this would be the case in which pMOSFET 308 and nMOSFET 310 were operated in their active regions, or perhaps replaced with high small-signal output impedance current sources. Let z denote this impedance. Making the simplifying assumption that the small-signal drain-source resistances of pMOSFET 308 and nMOSFET 310 are the same order of magnitude, one may approximate the small-signal input impedance as $Z_{IN} \approx z/(g_m r_{dsc})$, where $r_{dsc}$ is the small-signal drain-source resistance of common-gate pMOSFET 306. Also under these assumptions, the transimpedance may be approximated as $Z_T \approx z$, where recall that $z >> r_{dsc}$ because we have assumed high small-signal output impedance current sources.

Comparing $Z_{IN}$ and $Z_T$ for the two cases where pMOSFET 308 and nMOSFET 310 operate in their triode regions, and where these transistors are replaced by a high small-signal output impedance, it is seen that both the small-signal input impedance and transimpedance are less for the former case. Although the above expressions for $Z_{IN}$ and $Z_T$ were based upon a simple low frequency model and some simplifying assumptions, they nevertheless suggest that by operating pMOSFET 308 and nMOSFET 310 in their triode regions, a lower small-signal input impedance may be achieved at the expense of a lower transimpedance, compared to the case in which pMOSFET 308 and nMOSFET 310 are operated in their active regions or are replaced by high small-signal output impedance current sources. However, because the embodiment of FIG. 3a is motivated for short haul optical links in which signal strength is relatively large, this may be an advantageous tradeoff. It is to be remembered from FIGS. 2a and 2b that a photodetector may be modeled as small-signal current source 202 and small-signal internal capacitor 204, which may be relatively large. Consequently, for the amplifier of FIG. 3a it may be easier to match the amplifier small-signal input impedance to the small-signal output impedance of the photodetector than for some prior art amplifiers. Furthermore, it is found that the amplifier of FIG. 3a may still achieve a higher transimpedance than the prior art amplifiers of FIGS. 2a and 2b.

The design of amplifier of FIG. 3a also contributes to realizing a useful operating bandwidth for many optoelectronic applications. Because pMOSFET 308 and nMOSFET 310 operate such that the magnitudes of their gate-to-source voltages are each $V_{CC}$, a relatively large current flow for a given device size is achieved. Consequently, the embodiment of FIG. 3a may be designed with relatively small device sizes for pMOSFET 308 and nMOSFET 310. Reducing the device size of a MOSFET will, in general, reduce its small-signal parasitic capacitances, and if the drain current does not change, then the small-signal device resistance will remain substantially the same. This results in an overall reduction in the RC time constant, contributing to a wider operating bandwidth for the amplifier.

Consequently, it is seen from the above discussion that the embodiment of FIG. 3a may realize several advantages over the prior art amplifiers of FIGS. 2a and 2b. By having a single stage in which only one bias voltage is required, total DC power consumption may be reduced, along with a reduction in circuit complexity, compared to the case of providing multiple bias voltages. Also, by connecting the gate of pMOSFET 308 to ground and the gate of nMOSFET 310 to the power rail, the small-signal input impedance may be lowered, and the operating bandwidth may be increased.

Figure 3B:
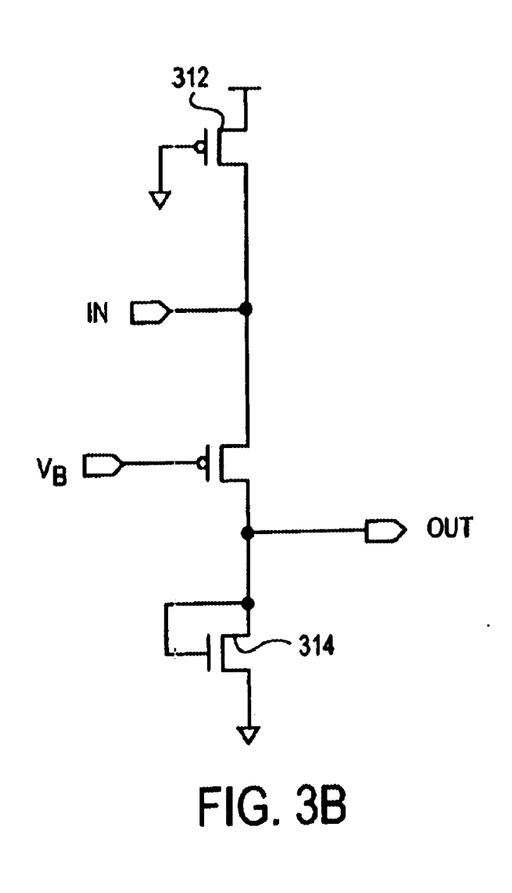

Another embodiment at the circuit level is provided in FIG. 3b, where pMOSFET 312 and nMOSFET 314 are diode-connected. Again, only one bias voltage is required for the circuit of FIG. 3b. However, because the magnitude of the gate-to-source voltages of pMOSFET 312 and nMOSFET 314 are less than $V_{CC}$, it is expected that their small-signal parasitic capacitances will not be reduced to that of FIG. 3a for the same drain-source current and other same process factors. Consequently, it is expected that the embodiment of FIG. 3a is most likely preferable to that of FIG. 3b.

Figure 5A:
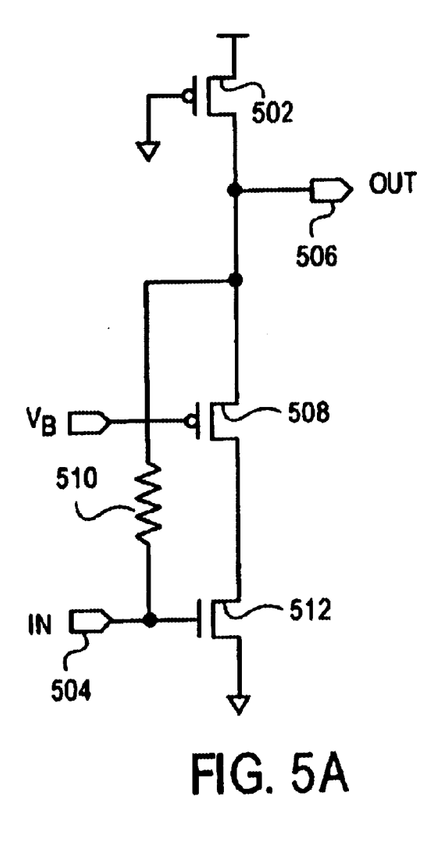
FIGS. 5a and 5b are transimpedance amplifiers according to embodiments of the present invention, each with negative feedback and a nMOSFET cascode pair.

Yet another embodiment of the present invention is provided at the circuit level in FIG. 5a, illustrating a single stage, common-source, common-gate transimpedance amplifier. Input port 504 receives a current signal from a current source, such as a photodetector, and an output voltage is provided at output port 506 in response to the input current signal. Input port 504 is connected to the gate of nMOSFET 512, in which case nMOSFET 512 may be referred to as a drive transistor. nMOSFETs 508 and 512 form a cascode pair, in which case nMOSFET 508 may be referred to as a cascode transistor. Only one bias circuit is required for providing the bias voltage $V_B$ at the gate of nMOSFET 508. Preferably, nMOSFET 508 is biased to operate in its active region. pMOSFET 502 provides bias current and an active load. The gate of pMOSFET 502 is connected to ground, so that it is expected to operate in its triode region. Resistor 510 provides negative feedback.

The embodiment of FIG. 5a shares many of the expected advantages as discussed for the embodiment of FIG. 3a. That is, power consumption may be reduced, and parasitic capacitances may be reduced because pMOSFET 502 may be sized smaller than if its gate where biased at some voltage above ground. Consequently, the embodiment of FIG. 5a may have a sufficiently wide operating bandwidth for opto-electronic applications.

Simulations for a 0.1 mA small-signal input show that the small-signal transimpedance for an amplifier of the type in FIG. 3a is 470Ω, with a 3 db bandwidth of 10 GHz and power consumption of 27.3 fJ of energy per transition of the received input signal. For an amplifier of the type in FIG. 5a, simulations for a 0.1 mA small-signal input show that the small-signal transimpedance is 72Ω with a 3 db bandwidth of 10 GHz and power consumption of 1.59 pF of energy per received input signal transition. In practice, the amplifier of FIG. 5a may be more stable than the amplifier of FIG. 3a because of negative feedback.

Figure 5B:
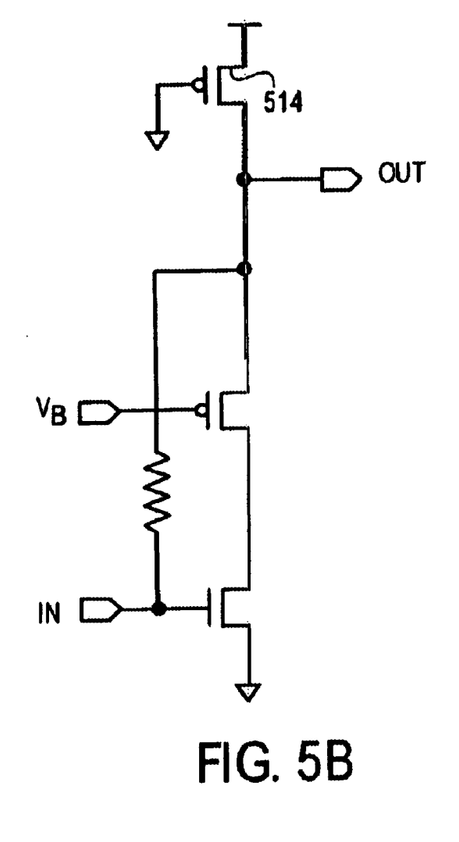

Another embodiment at the circuit level is provided in FIG. 5b, and is essentially the same as amplifier of FIG. 5a except that the gate of pMOSFET 514 is now connected to its drain so as to be in a diode-connected configuration. However, as discussed with respect to the amplifier of FIG. 3b, it is expected that the type of amplifier in FIG. 5a is most likely preferable to that of FIG. 5b.

Figure 6:
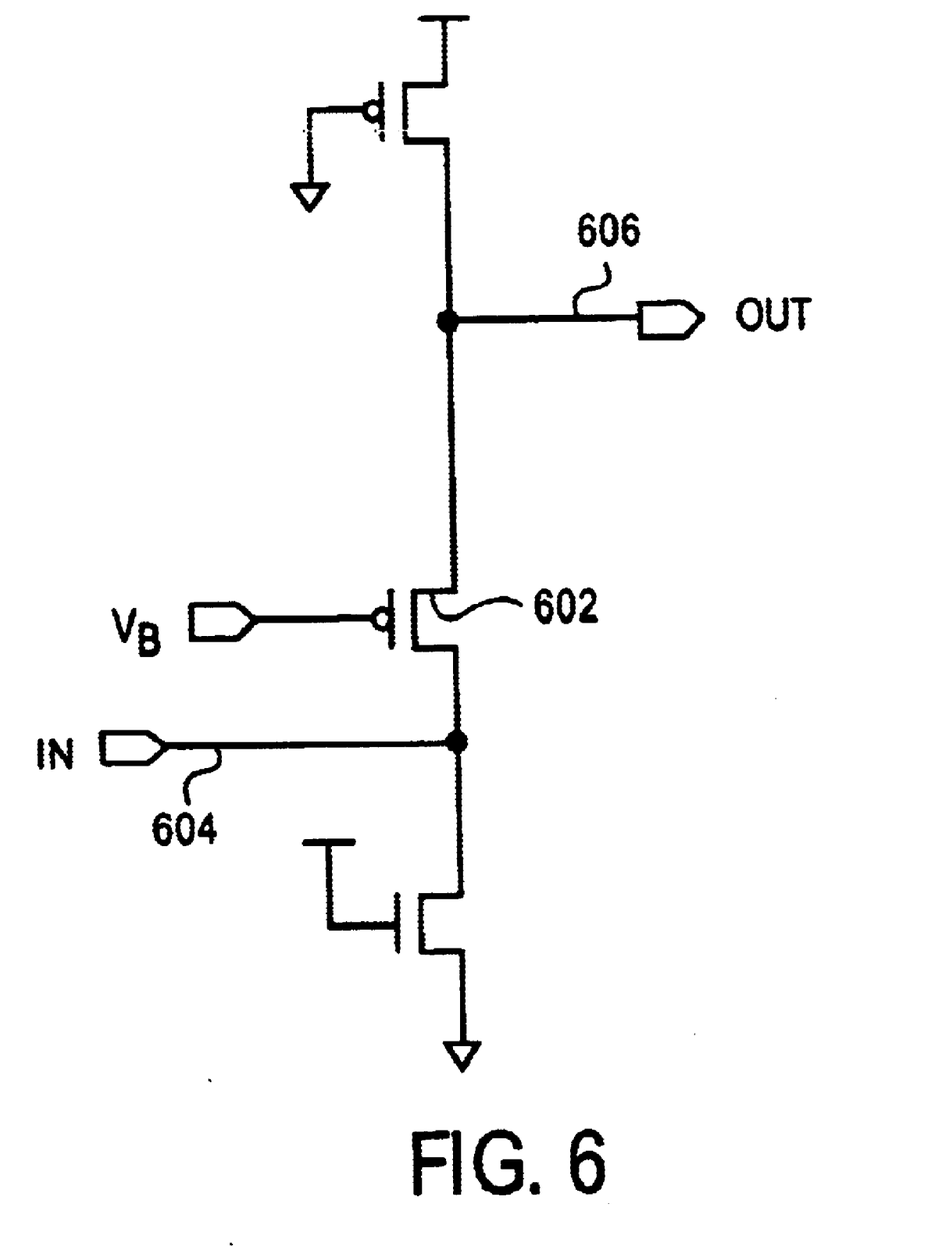
FIG. 6 is a transimpedance amplifier according to an embodiment of the present invention, with a nMOSFET common-gate transistor.
Figure 7:
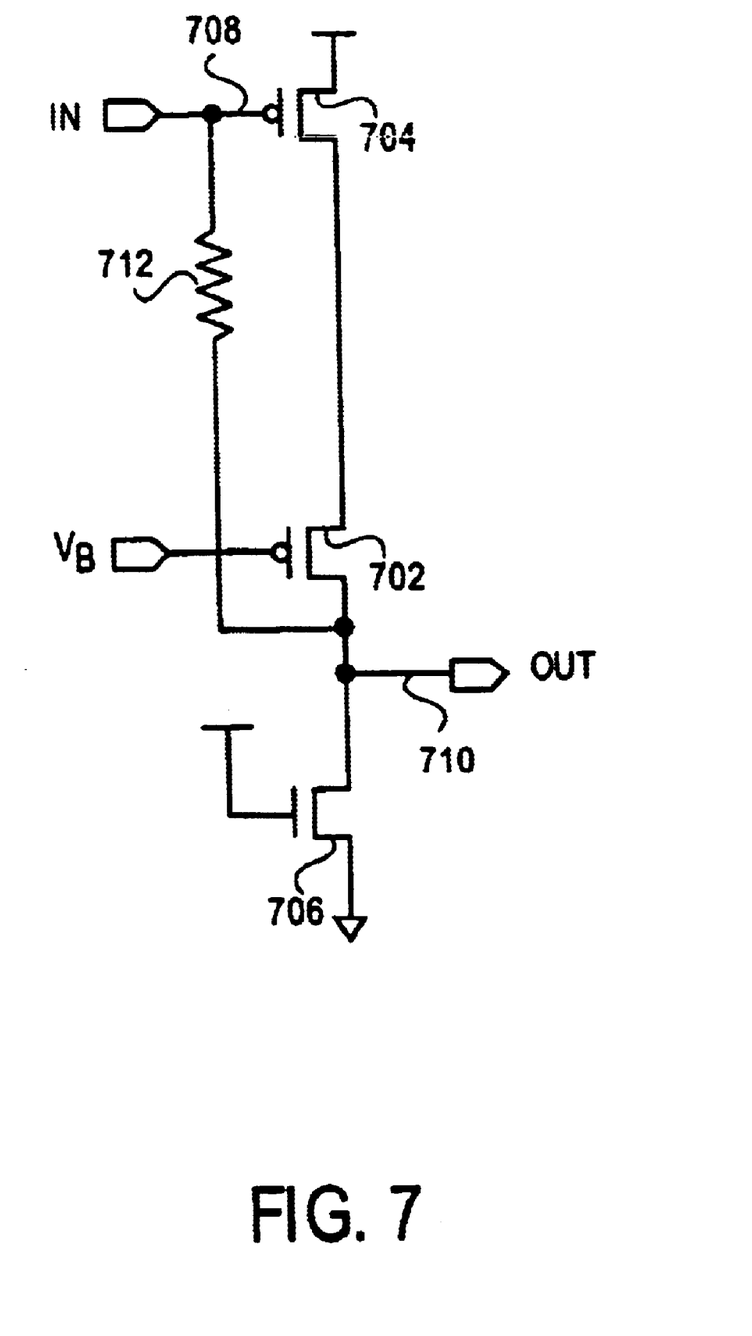
FIG. 7 is a transimpedance amplifier according to an embodiment of the present invention, with negative feedback and a pMOSFET cascode pair.

Various modifications may be made to the disclosed embodiments without departing form the scope of the invention as claimed below. For example, the amplifier in FIG. 6 is a modification of the amplifier in FIG. 3a, in which common-gate nMOSFET 602 is used instead of a pMOSFET as in FIG. 3a. Note that input port 604 is connected to the source of nMOSFET 602, and output port 606 is taken at the drain of nMOSFET 602. As another example, the amplifier in FIG. 7 is a modification of the amplifier in FIG. 5a, where common-gate cascode pMOSFET 702 and drive pMOSFET 704 are connected as a cascode pair instead of using nMOSFETs as in FIG. 5a. The gate of nMOSFET 706 is connected to the power rail, so that it operates in its triode region. Input port 708 is connected to the gate of drive pMOSFET 704, and output port 710 is taken at the drain of cascode pMOSFET 702. Negative feedback is provide via resistor 712.

What is claimed is:

1. An amplifier comprising:
   a ground to provide a ground voltage;
   a bias circuit to provide a bias voltage above the ground voltage;
   an input port;
   an output port;
   a drive nMOSFET having a gate connected to the input port, and a drain;
   a common-gate nMOSFET having a gate biased by the bias circuit, a drain connected to the output port, and a source coupled to the drain of the drive nMOSFET in cascode fashion;
   a pMOSFET having a gate connected to ground, and a drain coupled to the drain of the common-gate nMOSFET to provide bias current; and
   a resistor coupling the output port to the input port to provide negative feedback.

2. The amplifier as set forth in claim 1, wherein:
   the source of the common-gate nMOSFET is directly connected to the drain of the drive nMOSFET; and
   the drain of the pMOSFET is directly connected to the drain of the common-gate nMOSFET.

3. A computer system comprising:
   a photodetector comprising an output port; and
   an amplifier comprising:
     a ground to provide a ground voltage;
     a bias circuit to provide a bias voltage above the ground voltage;
     an input port;
     an output port;
     a drive nMOSFET having a gate connected to the photodetector output port, and a drain;
     a common-gate nMOSFET having a gate biased by the bias circuit, a drain connected to the amplifier output port, and a source coupled to the drain of the drive nMOSFET in cascode fashion;
     a pMOSFET having a gate connected to ground, and a drain coupled to the drain of the common-gate nMOSFET to provide bias current; and
     a resistor coupling the amplifier output port to the input port to provide negative feedback.

* * * * *